United States Patent
Matsutori et al.

(10) Patent No.: US 7,216,766 B2
(45) Date of Patent: May 15, 2007

(54) THIN PLATE STORAGE CONTAINER WITH HANDLED SUPPORTING MEMBER

(75) Inventors: Chiaki Matsutori, Shisui-machi (JP); Takaharu Oyama, Shisui-machi (JP)

(73) Assignee: Miraial Co., Ltd., Tokyo (JP)

( * ) Notice: Subject to any disclaimer, the term of this patent is extended or adjusted under 35 U.S.C. 154(b) by 0 days.

(21) Appl. No.: 11/242,531

(22) Filed: Oct. 4, 2005

(65) Prior Publication Data
US 2006/0027477 A1 Feb. 9, 2006

Related U.S. Application Data

(62) Division of application No. 10/712,014, filed on Nov. 14, 2003, now Pat. No. 7,017,750.

(30) Foreign Application Priority Data

Dec. 2, 2002 (JP) ............................. 2002-349457
Feb. 13, 2003 (JP) .............................. 2003-35062

(51) Int. Cl.
  B65D 85/00 (2006.01)
  B65D 23/10 (2006.01)
  A47G 19/02 (2006.01)
  B65G 7/12 (2006.01)

(52) U.S. Cl. .................... 206/710; 206/454; 211/41.18; 220/758; 220/772; 294/27.1

(58) Field of Classification Search ........ 206/710–711, 206/454; 211/41.18; 220/758, 772; 294/27.1–34; 414/940, 217–217.1
See application file for complete search history.

(56) References Cited

U.S. PATENT DOCUMENTS

| | | | | |
|---|---|---|---|---|
| 4,520,934 A | * | 6/1985 | Aigo ........................ | 211/41.18 |
| 5,609,376 A | * | 3/1997 | Lardinais et al. .......... | 294/27.1 |
| 5,788,082 A | * | 8/1998 | Nyseth ........................ | 206/711 |
| 5,823,593 A | * | 10/1998 | Glick et al. ................ | 294/27.1 |
| 6,105,782 A | | 8/2000 | Fujimori et al. | |
| 6,186,331 B1 | | 2/2001 | Kinpara et al. | |
| 6,382,419 B1 | * | 5/2002 | Fujimori et al. ............ | 206/454 |
| 6,464,081 B2 | | 10/2002 | Nyseth et al. | |
| 6,474,474 B2 | | 11/2002 | Hyobu et al. | |
| 6,736,268 B2 | | 5/2004 | Nyseth et al. | |
| 6,776,289 B1 | | 8/2004 | Nyseth | |

(Continued)

FOREIGN PATENT DOCUMENTS

EP    1255282    11/2002

(Continued)

Primary Examiner—Bryon P. Gehman
(74) Attorney, Agent, or Firm—Bacon & Thomas, PLLC

(57) ABSTRACT

A wafer storage container has a container body and a lid. The container body has lid support inserts in a lid receptacle, and the lid has corner inserts for contact with the lid support inserts to support the lid. A supporting member is attached to the container body. The supporting member includes a base plate portion, side plates extending from the base plate portion, and a handle on each side plate for lifting the container body. The thin plate supporting member has contacting portions to support the thin plates, supporting members which elastically support the contacting portions, and a base support bar to support the supporting portions. The tip end of each supporting portion contacts a support stage, and elastically supports the contacting portions from both sides.

4 Claims, 19 Drawing Sheets

U.S. PATENT DOCUMENTS

| | | |
|---|---|---|
| 6,779,667 B2 * | 8/2004 | Nigg et al. .......... 206/711 |
| 2002/0020650 A1 * | 2/2002 | Fujimori et al. ........ 206/454 |
| 2002/0038773 A1 * | 4/2002 | Fujimori et al. ........ 206/454 |
| 2003/0010673 A1 | 1/2003 | Duban-Hu et al. |
| 2003/0141217 A1 | 7/2003 | Park |

FOREIGN PATENT DOCUMENTS

| | | |
|---|---|---|
| JP | 5-507817 | 11/1993 |
| JP | 11-168136 | 6/1999 |
| JP | 2000-91409 | 3/2000 |
| JP | 2000-159288 | 6/2000 |
| JP | 2000-306988 | 11/2000 |
| JP | 2002-9142 | 1/2002 |
| JP | 2002-299428 | 10/2002 |
| JP | 2002-347061 | 12/2002 |
| JP | 2002-353299 | 12/2002 |
| JP | 2002-353301 | 12/2002 |
| JP | 2002-368074 | 12/2002 |
| WO | 92/16964 | 1/1992 |
| WO | 03/018434 | 3/2003 |

* cited by examiner

THIN PLATE STORAGE CONTAINER WITH HANDLED SUPPORTING MEMBER

CROSS-REFERENCE TO RELATED APPLICATION

This application is a division of non-provisional application 10/712,014, filed Nov. 14, 2003, now U.S. Pat. No. 7,017,750. This application claims, under 35 USC 119, priority of Japanese Application No. 2002-349457 filed Dec. 2, 2002 and Japanese Application No. 2003-35062 filed Feb. 13, 2003.

BACKGROUND OF THE INVENTION

The present invention relates to a thin plate storage container, in which the load on the container body in transportation is reduced to improve sealing. The present invention further relates to a thin plate storage container for securely supporting a plurality of thin plates stored within the container body.

The transportable containers for containing and transporting semiconductor silicon wafers are generally known. In such a wafer container, it is important to keep its inside clean to prevent dirt and the like from collecting on the surfaces of contained semiconductor silicon wafers during transportation. For this purpose, the container is sealed tightly, usually by a sealing member on the lid of the container, which sealing member contacts the container body to seal it when the lid closes the container body.

In addition, the thin plate storage containers have a handle on each side of to be gripped for carrying by hand.

Semiconductor silicon wafers are stored in the in the above-mentioned containers for transfer to a semiconductor manufacturing factory and the like, where the container goes through a production line.

Moreover, it is necessary that the wafer container support the semiconductor silicon wafers at regularly spaced intervals to keep them from contacting each other. Therefore supporting members are placed on both the interior of the container body and on the interior side of the lid to support semiconductor silicon wafers at regularly spaced intervals.

An example of a supporting member incorporated into a lid is illustrated in FIG. 26. This supporting member is disclosed in Japanese TOKUHYOHEI No. 5-507817. As shown in FIG. 26, an upper cover 35 has a holder 36 for supporting semiconductor silicon wafers from above, mounted on its inner side. The semiconductor silicon wafers 37 are stored in the container body (not illustrated) positioned below the upper cover 35.

The wafer holder 36 has supporting arm portions 38 alternately extending from right and left. Base ends of the supporting arms 38 are fixed to the interior side of upper cover 35, and the opposite ends extend toward the semiconductor silicon wafers 37. A holddown member 39 at the tip of each of the supporting arm 38 engages an edge portion of a semiconductor silicon wafers 37 to support each semiconductor silicon wafer 37 at regularly spaced intervals.

In order to manually lift and lower for transport and the like, a worker grips the handles to hold the thin plate storage container. However, since the handles are located on the sidewalls of the thin plate storage container, the sidewalls receive a load when the thin plate storage container is lifted, whereby the opening of the container body can be slightly distorted and the sealing member can slip slightly. This effect is undesirable although there is no problem with the sealing.

There is a slight gap between the container body and the lid when the container body is fitted with the lid. Although there is no problem in normal use of the thin plate storage container, there is the possibility that the thin plate storage container will receive a shock when the thin plate storage container is mounted in use. In this case, the lid can slip because of the gap between the container body and the lid and the sealing member will also slip. In such an event, although there is no sealing problem, the result is not the desired perfection.

Moreover, in the thin plate storage container having the above-described structure, each of the supporting arm portions 38 of the wafer holder 36 is cantilevered such that base end of the arm is fixed to the upper cover 35 and the distal end is free. The supporting arm portions 38 thereby hold the semiconductor silicon wafers 37 with a comparatively weak force, and it is difficult to strongly hold the semiconductor silicon wafers 37. Therefore, it is difficult to securely hold a semiconductor silicon wafer 37 of a large radius and heavy weight and there is the problem that the semiconductor silicon wafers 37 shake within the container.

Because the wafer holder 36 is cantilevered, i.e. each holddown member 39 pivots about its base, if the semiconductor silicon wafers 37 slip, there is the problem that friction is generated between the holddown members 39 and the semiconductor silicon wafers 37 and particulate matter thereby generated.

SUMMARY OF THE INVENTION

The aim of the present invention is to provide a thin plate storage container wherein the lid is prevented from slipping, the load on the container body in conveyance is reduced to improve sealing, and a plurality of the thin plates can be securely held within the container body.

The thin plate storage container of the first embodiment of the present invention comprises a container body, for storing a plurality of thin plates, and a lid for closing and sealing the container body. The lid is taken off to remove and insert the thin plates into the container body lying broadwise. The container body includes four side walls extending to a lid receptacle (flange) for receiving the lid and surrounding the opening of the container body, and lid support inserts located on at least the bottom edge of the lid receptacle when the container body lies broadwise, to support the lid. Lid edge inserts, e.g., corner inserts located on the periphery of the lid opposite the lid support inserts, cooperate with the lid support inserts to support the lid.

Owing to the lid support inserts in the lid receptacle of the container body directly contacting the lid edge inserts on the periphery of the lid or with a slight gap therebetween when the lid is placed on the container, if the container body receives a shock through careless handling of the thin plate storage container, the lid will not slip from the container body.

It is preferred that each of the lid support inserts be formed as a convex dovetail to mate with a dovetail groove in the lid receptacle, and that the contacting surface of each of the lid support inserts be planar.

The lid receptacle is a flange including four corner portions, four planar edge surfaces connecting and integral with the four corner portions and a shoulder portion spaced from the container opening by the planar edge surfaces.

Generation of dust and the like can be kept to the minimum because each contacting surface is planar. The material of the lid support inserts and that of the corner inserts are selected to minimize dust generation when they are rubbed by each other.

It is preferable that each of the corner inserts includes a fixing plate portion to be inserted into and fixed in an engagement groove located at a corner of the lid, and that the contacting plate portion of the corner insert be curved to conform to the corner of the lid and that the outside of the contacting plate portion form planar contacting surfaces for contacting the lid support inserts.

The contacting plate portion is positioned to cover a corner of the lid by insertion of the fixing plate portion into the engagement groove at the corner of the lid. Thus mounted, the planar contacting surfaces, at both ends of the contacting plate, are in contact with a lid support insert to support the lid. Thereby, the lid scarcely slips when the container body receives a shock, and sealing quality is improved.

The thin plate storage container of the second embodiment comprises a container body for storing and holding a plurality of thin plates in a clean condition, and a lid for closing and sealing the interior of the container body. When the container body is lying broadwise, it rests on a supporting member fitted thereto, and which comprises a base plate positioned under and supporting the container body, when lying broadwise, and side plates extending from opposing ends of the base plate portion.

Handles are provided on the side plates for lifting the container body. When these handles are gripped and lifted, the supporting member is held directly, with the container body supported by the base plate. Thereby, any distortion caused by lifting is absorbed by the base plate and the side plates of the supporting member, so that any ill effect on the container body is minimized.

It is preferable that detents be provided in opposing side walls of said container body so that the container body can be supported more securely by the supporting members by engagement with lugs on the opposing sidewalls of the container body with the side plates of the supporting member.

It is preferable that conveyor rails be provided on the side plates of the supporting member so that the thin plate storage container 1 can be transferred by suspension from the conveyor rails of a conveyor in a production line or the like without any further attachment or modification.

It is preferable that positioning means be provided on the base plate portion of the supporting member for precise adjustment of the mounting position of the container body.

The thin plate storage container of the third embodiment comprises a container, for storing and supporting a plurality of thin plates in clean condition, a lid for closing and sealing the container body, and a thin plate supporting member on the inner surface of the lid to support the thin plates at regular intervals. The thin plate supporting member comprises contacting portions for engaging the periphery of each of the thin plates, supporting portions which elastically support the contacting portions, and a base support bar fixed to the inside of the lid to integrally support all of the plurality of the supporting portions aligned in parallel at regular intervals. Each base of the supporting portions is integrally connected with the base support bar, and the contacting portions are positioned in the middle of the supporting portions, and the tip of the supporting portions contact the inner surface of the lid to elastically support the contacting portions from both sides. Thin plates having large diameter and heavy mass can thereby be held securely because the supporting portions elastically support the contacting portions from both sides.

It is preferable that base side of each supporting portion be formed relatively long, and that the tip side be formed relatively shorter. Since the distance between the base support bar portion and each of the contacting portions is relatively long, the supporting portions push the contacting portions of the thin plate with a weak force. In addition, because each tip side of the contacting portions is in contact with the inner surface of the lid, the contacting portions are elastically supported from both sides. The contacting portions are pushed toward the periphery of the thin plates with a strong force since the tip sides extending from the contacting portions are relatively short. Although there is no difference in elastic coefficient between the two portions on opposite sides of each contacting portion, the supporting portions support the contacting portions with strong force since the tip sides are relatively short.

It is preferable that the supporting portions are formed to extend, at both sides of the contacting portions toward the thin plates within the container body, so as to exert a strong elastic force.

It is preferable that support stages be provided on the inner surface of the lid to support the tip ends of the supporting portions. Thus, the supporting portions are supported from both sides by the support stages on the inner surface of the lid to support the tips of the supporting portions. Therefore the contacting portions are supported by the supporting portions from both sides.

It is preferable that engagement portions which engage and support the tip ends of the supporting portions are formed on the support stages, so that the tip of each of the supporting portions is supported securely by engagement with the engagement portions of the support stages. Therefore, the contacting portions are stably supported by the supporting portions.

It is preferable that support stages be fixed to the inner side of the lid to support the contacting portions elastically from the tip side, whereby the contacting portions are elastically supported by contact with the support stages fixed to the inner side of the lid.

The thin plate supporting members are arranged opposing each other, with the contacting portions of both aligned and spaced to support the thin plates at regular intervals.

DESCRIPTION OF THE PREFERRED EMBODIMENT

Hereinafter, the present invention will be described by way of two embodiments with reference to the attached drawings.

First Embodiment

In the first embodiment, a storage container to store and transport semiconductor silicon wafers as thin plates is given as an example.

Figure 1:
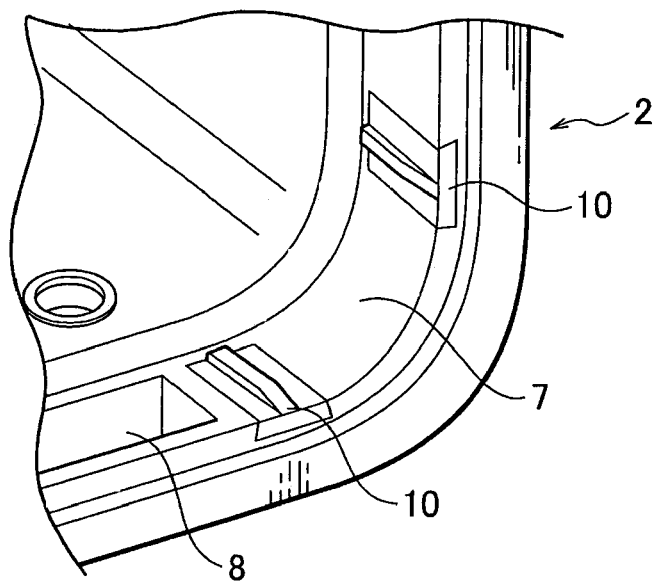
FIG. 1 is a partial perspective view of a main part of a container body of a wafer storage container according to a first embodiment of the invention.
Figure 2:
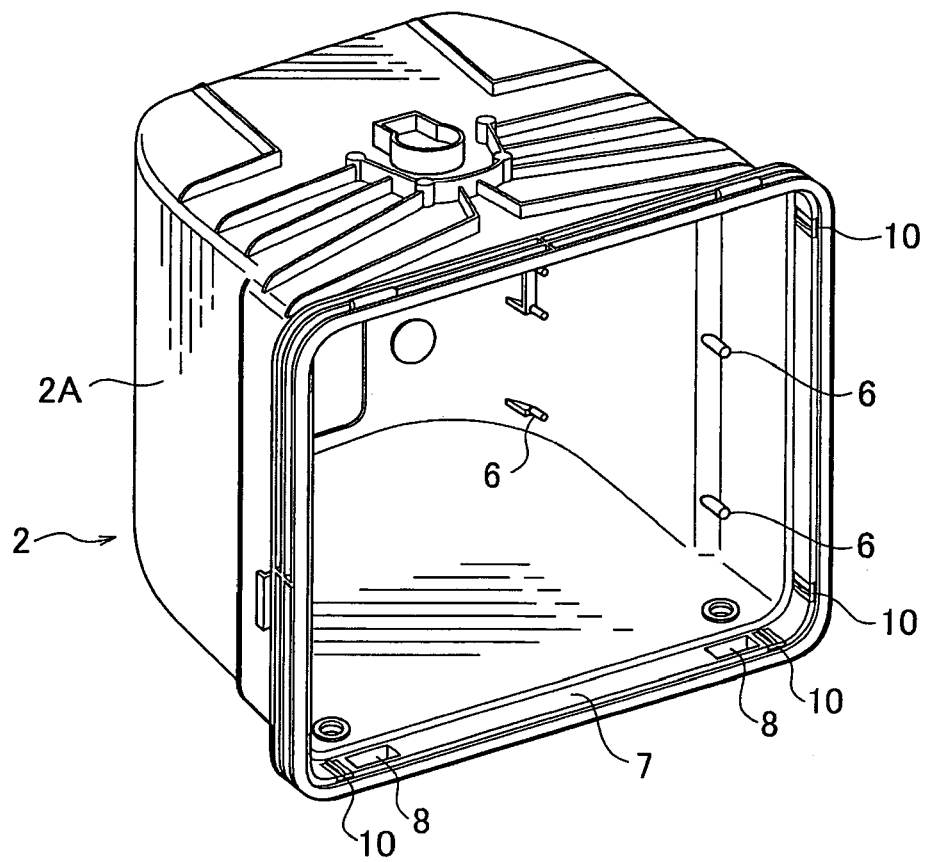
FIG. 2 is a perspective view of a container body of a wafer storage container according to a second embodiment.
Figure 3:
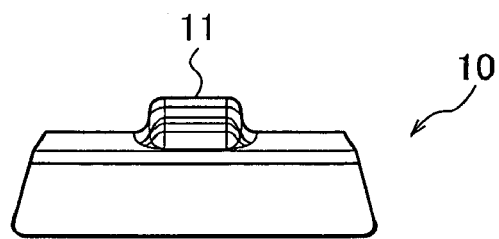
FIG. 3 is a front view of a lid support insert.
Figure 4:
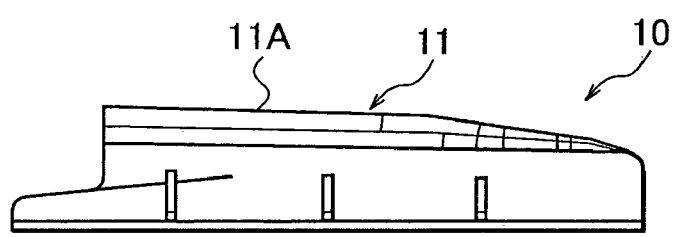
FIG. 4 is a side view of the lid support insert of FIG. 3.
Figure 5:
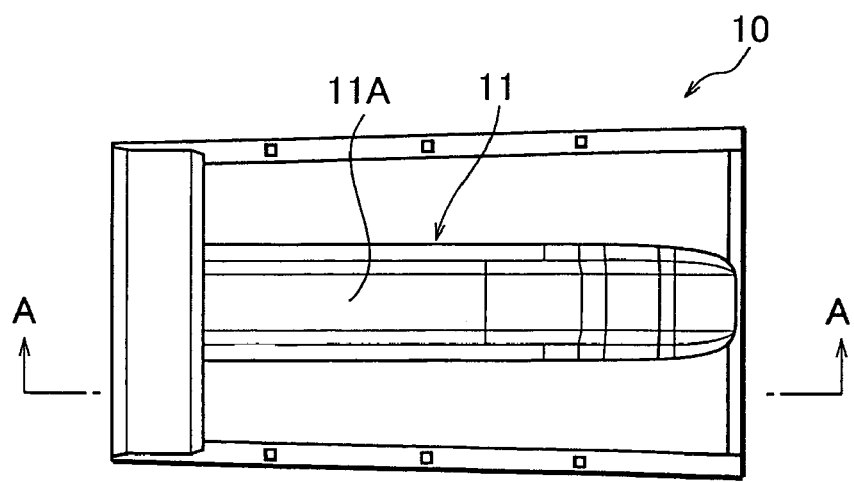
FIG. 5 is a top view of the lid support insert of FIG. 3.
Figure 6:
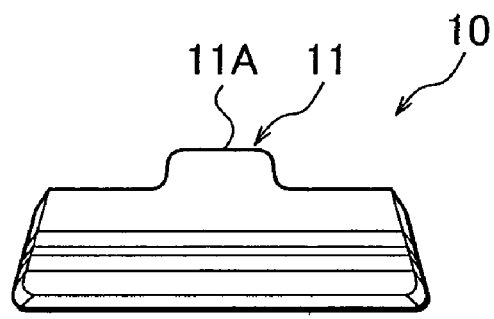
FIG. 6 is a rear view of the lid support insert of FIG. 3.
Figure 9:
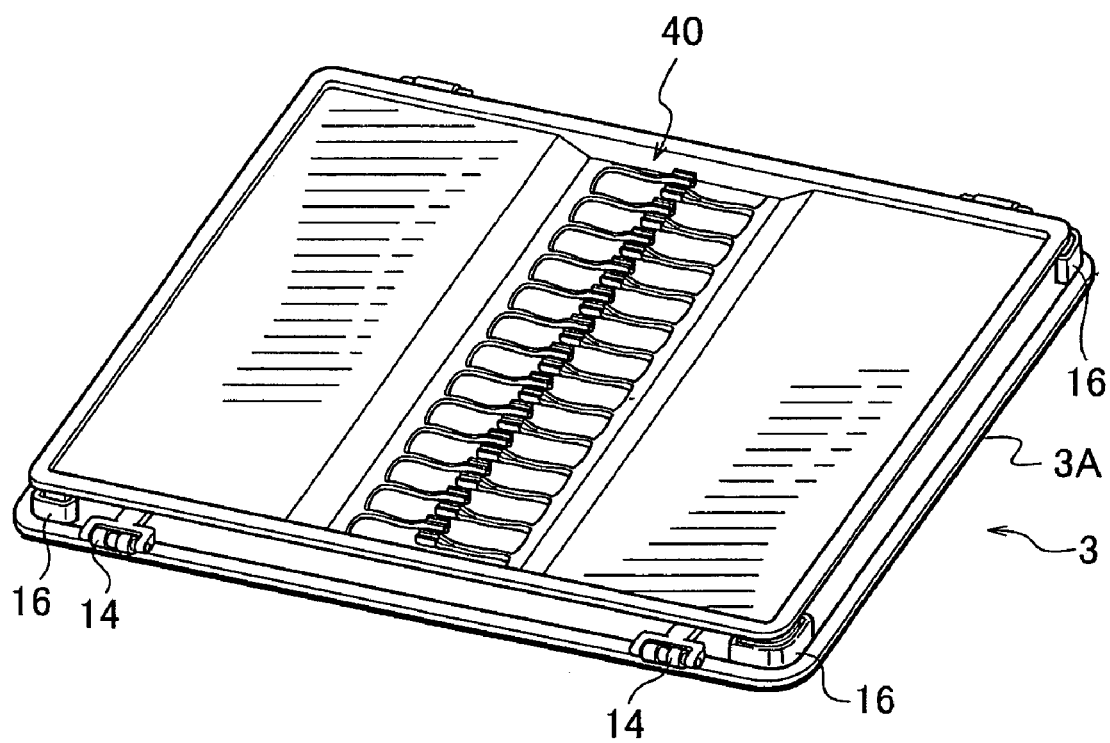
FIG. 9 is a perspective view of the lid.
Figure 13:
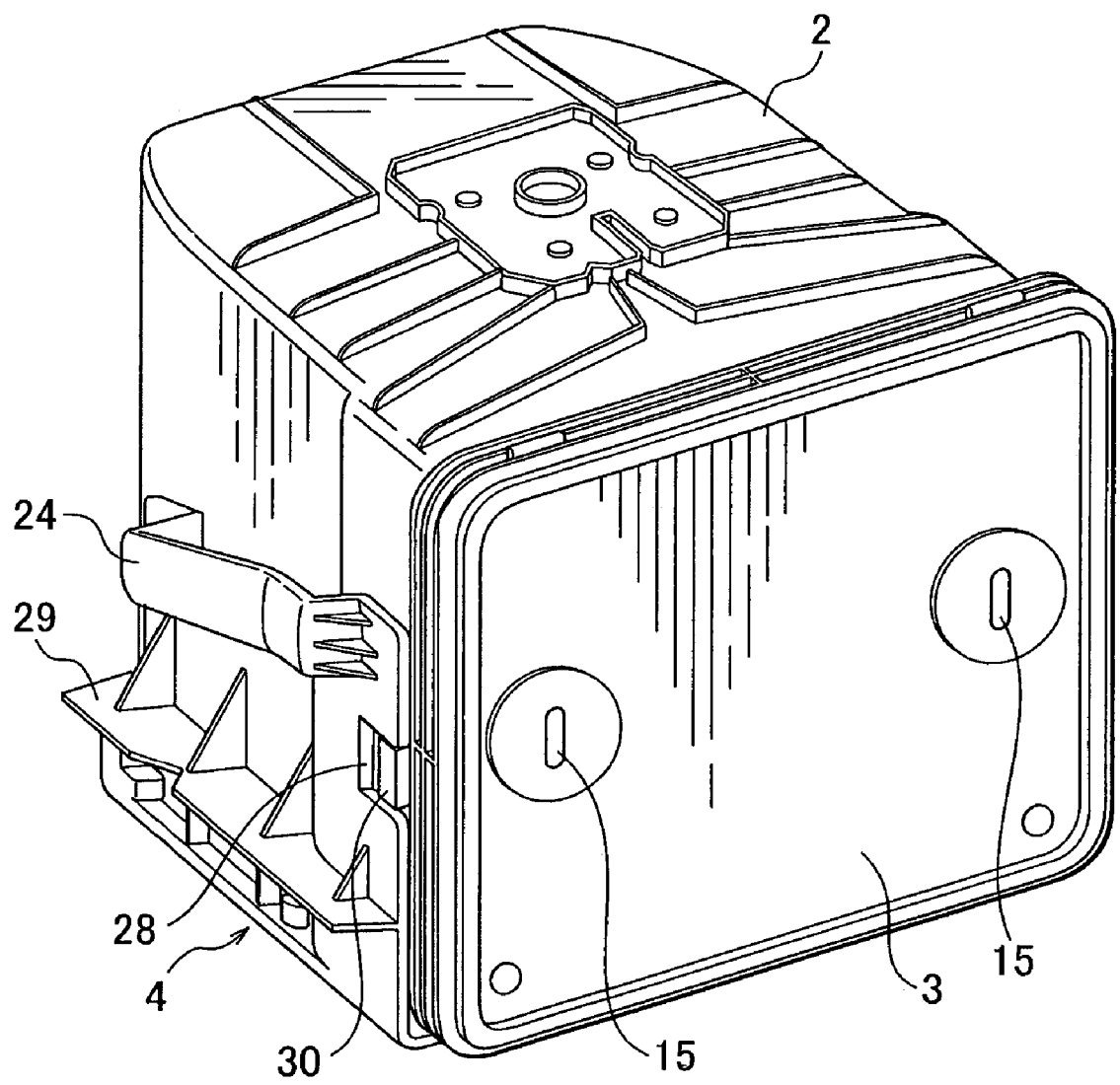
FIG. 13 is a perspective view of the wafer storage container of the invention.
Figure 14:
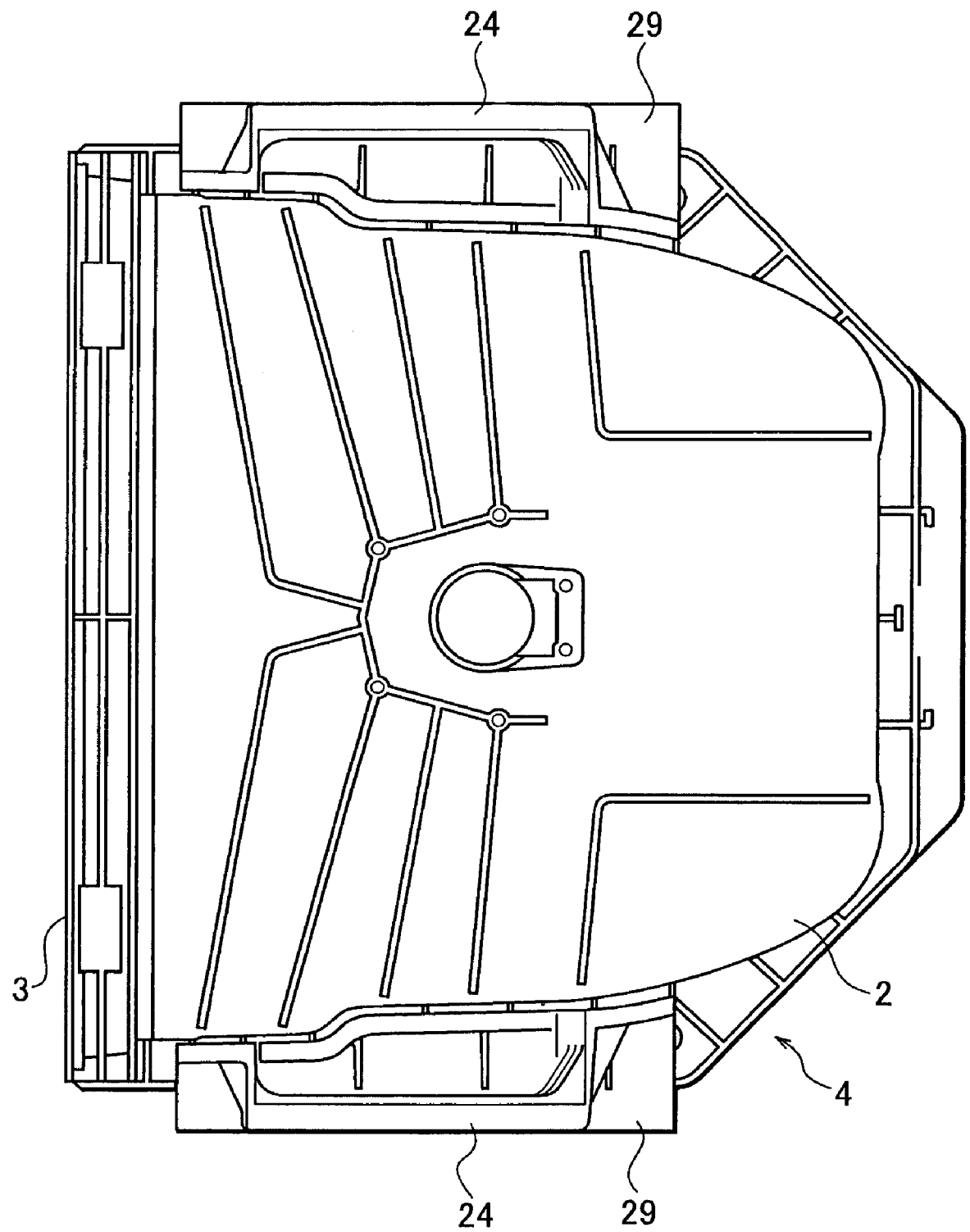
FIG. 14 is a top view showing the wafer storage container.
Figure 15:
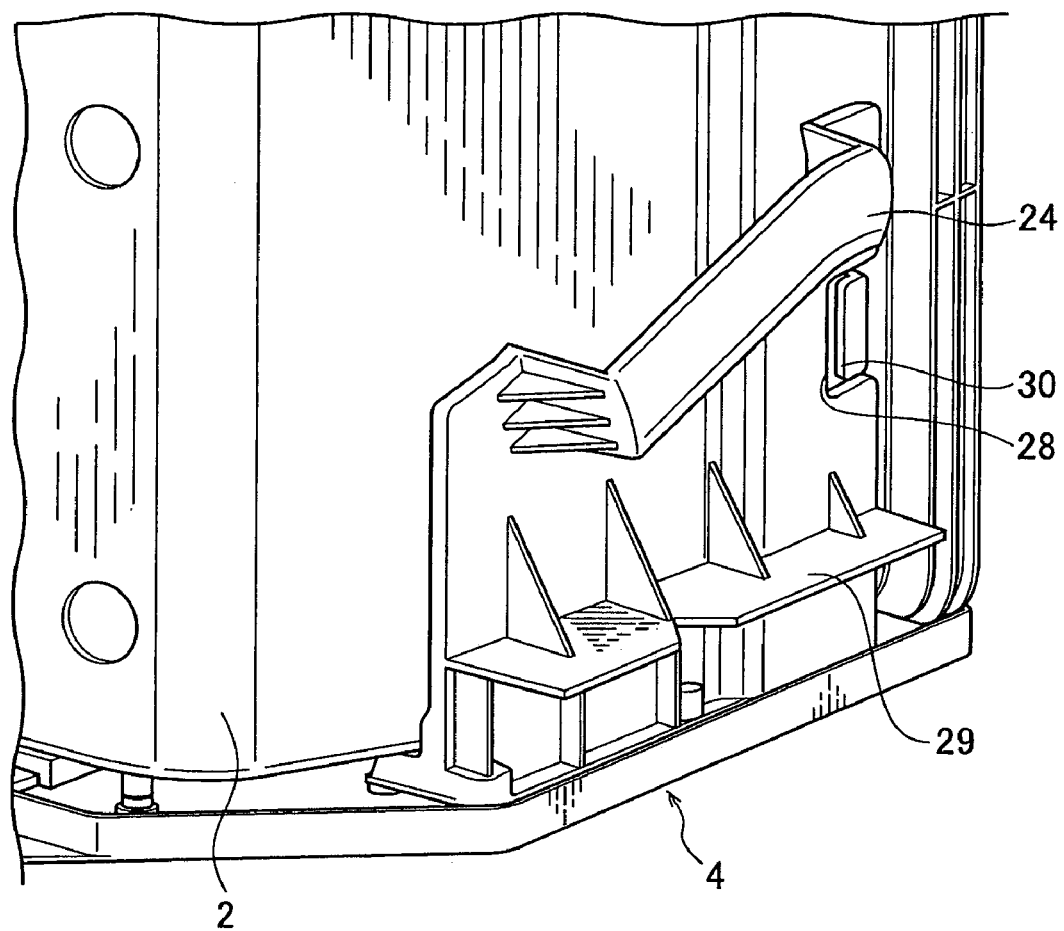
FIG. 15 is a perspective view of a main part of the wafer storage container.
Figure 16:
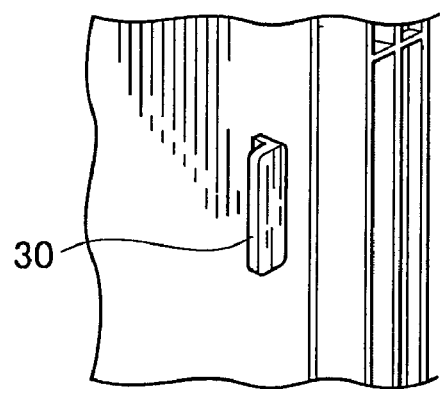
FIG. 16 is a perspective view of a detent.
Figure 17:
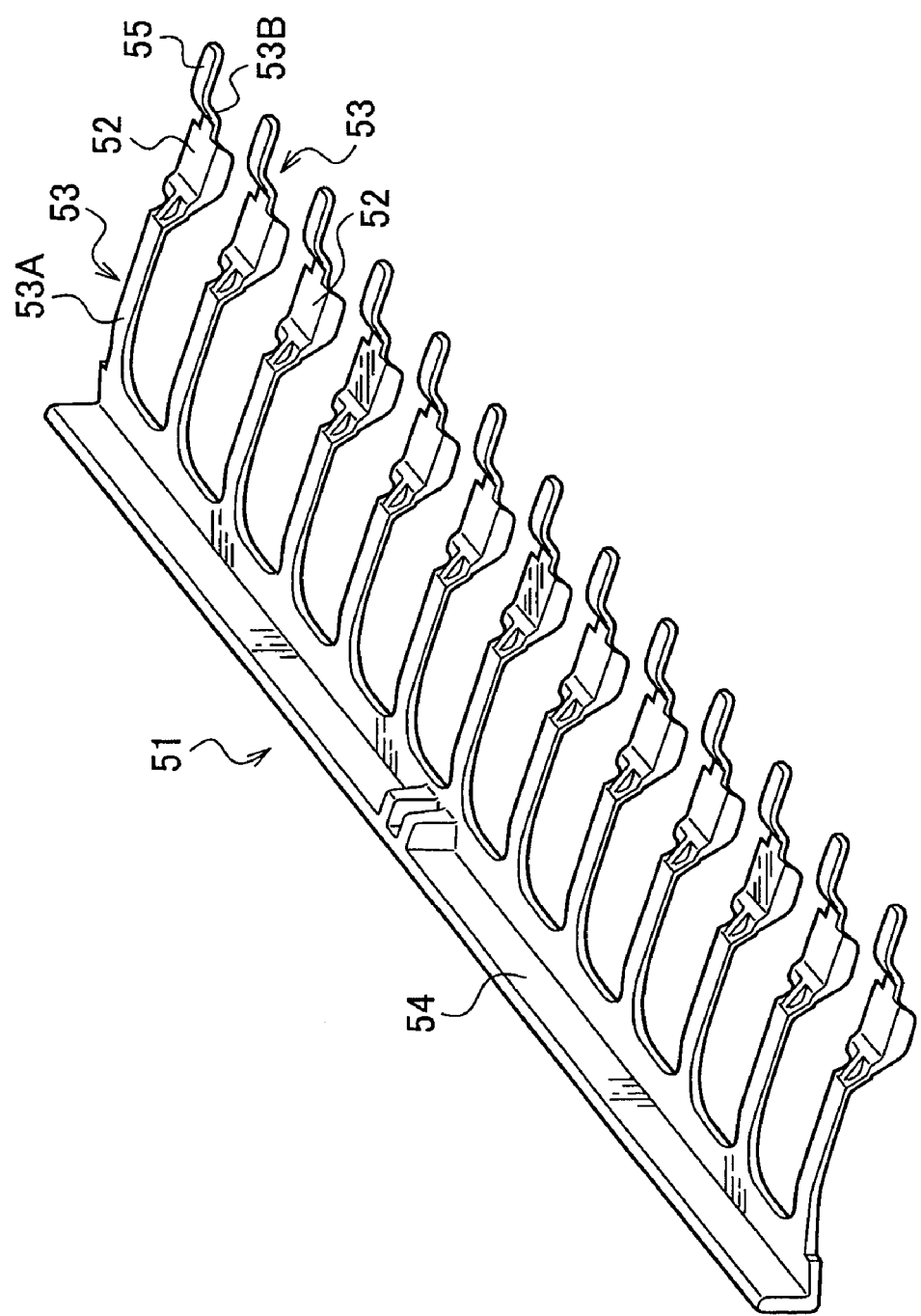
FIG. 17 is a perspective ("top") view of a thin plate supporting member of a thin plate storage container according to the second embodiment.

This wafer storage container 1 comprises, as shown in FIGS. 2, 9, and 13, a container body 2 for supporting a plurality of semiconductor silicon wafers (not shown), and wafer supporting plates (not shown) on the inside surface of two sidewalls inside of this container body 2 facing each other to support a plurality of semiconductor silicon wafers, stored in parallel and at regular intervals, from both sides of the wafer. A lid 3 seals the upper opening of the container body 2 and keeps the inside clean. A supporting member 4 supports the container body 2.

The container body 2 is formed generally in the shape of a cube. For supporting detachable wafer supporting plates, a plurality of supporting protrusions 6 is placed on rear side and back side, inside of sidewall portions 2A and 2B of the container body 2. A lid receptacle 7 surrounds the opening of the container body 2 to engage with the lid. This lid receptacle 7 (flange) is formed by extending the upper edges of the side walls of the container body 2 to the outer diameter of the lid.

Engagement slots 8 are formed in the lid receptacle 7 to engage with stop rollers 14 of the lid 3 (FIG. 9). These engagement slots 8 are provided at each of four corners.

Figure 7:
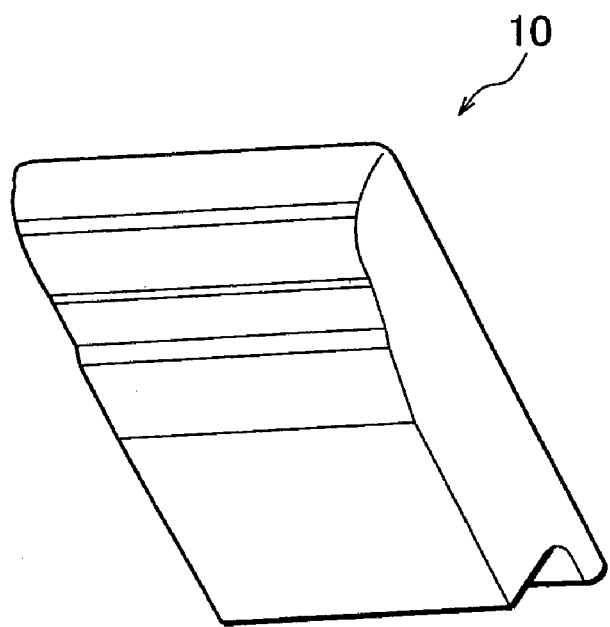
FIG. 7 is a perspective view of a modified lid support insert.

Lid support inserts 10 are placed at each of the four corners of the lid receptacle. Lid support inserts 10 are, as shown in FIG. 1–6, formed like wedges having dovetail on both sides to engage dovetail grooves on the lid receptacle 7. At the center surface of each lid support insert 10, a protruding ridge 11 extends the entire length of the lid support insert. A taper is formed on the outside of the protruding ridge 11 (right side of FIG. 4) to prevent contact with corner inserts 16 when the lid 3 is attached and detached. On the rear side of the protruding ridge 11 is a contact protrusion 11A. This contact protrusion 11A is positioned to contact a corner insert 16, and is formed flat. Since there is a taper on the contact protrusion 11A, uneven contacting pressure results over all the contacting surface, and dust is generated. Besides, although the contact protrusion 11A is narrow because of the configuration of the protruding ridge 11, the area of the contact protrusion 11A is set to provide a balance between load and friction. It is preferable that the contact protrusion 11A be as narrow as possible since there is a possibility of contact between the corner insert and the lid support insert 10 when the lid 3 is attached and detached. On the other hand, the protruding ridge 11 must support the weight of the lid 3. For this reason, the area of the contact protrusion 11A is minimized to balance the weight of the lid 3. If the lid 3 is large and heavy, to broaden its contacting area, the protruding ridge 11 can be omitted as in FIG. 7.

A pair of lid support inserts 10 is placed at each four corners of the lid receptacle 7. In particular, the pair of lid support inserts 10 is engaged with a pair of dovetail grooves on each of four corners of the lid receptacle 7, so that each pair of the lid support inserts 10 at each corner of the lid receptacle 7 supports each corner of the lid 3 squarely.

Figure 8:
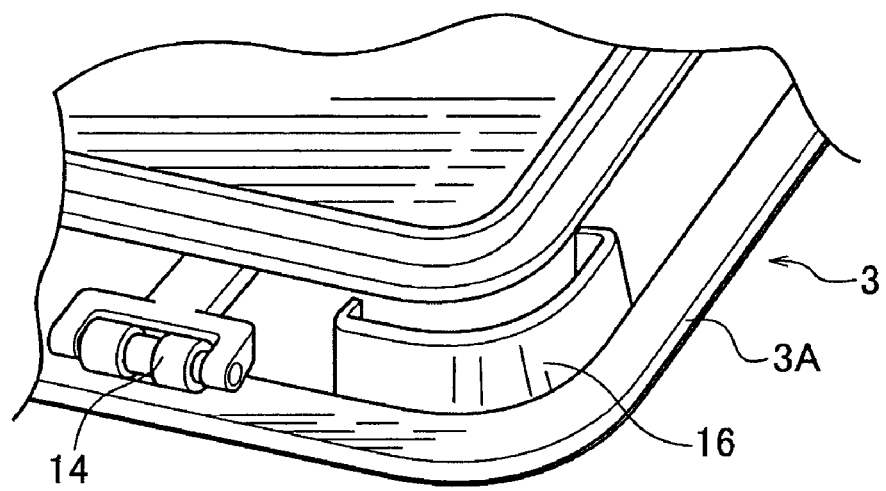
FIG. 8 is a perspective view of a corner portion of the lid.

The lid 3 is, as shown in FIGS. 8 and 9, formed as a thick quadrangular plate and mates with the lid receptacle 7 of the container body 2. A flange portion 3A is formed on the outer side of the lid 3 (lower part of FIG. 9) to cover the outside of the lid receptacle 7 when the lid 3 is seated within the lid receptacle 7. A stop roller 14 is located near each corner of the lid 3. On the surface of the lid 3, a pair of key openings (shown in FIG. 13) is provided to retract each stop roller 14 freely. The stop roller 14 is connected by a link (not shown) whereby it is extended to engage within an engagement slot 8 by insertion and rotation of the key. The key is placed on an arm of a transport mechanism in a production line or the like, and then the lid 3 is automatically attached and detached. A sealing member (not shown) is placed on the inside periphery of the lid 3.

Figure 10:
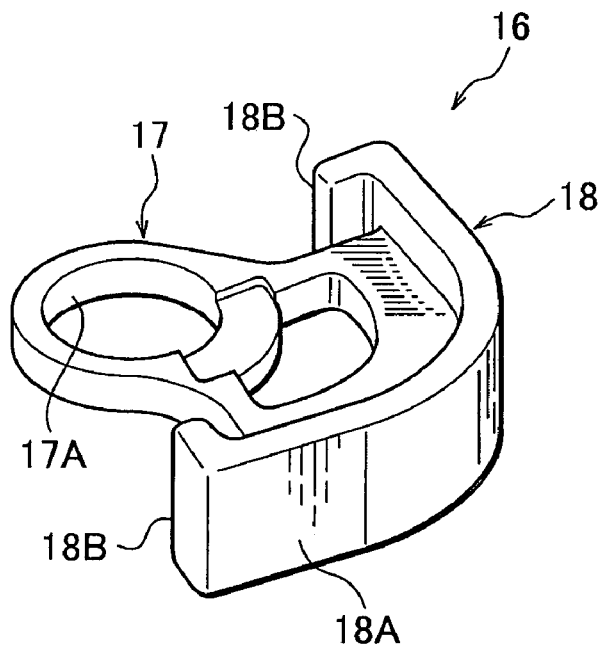
FIG. 10 is a perspective view of a lid corner insert.
Figure 11:
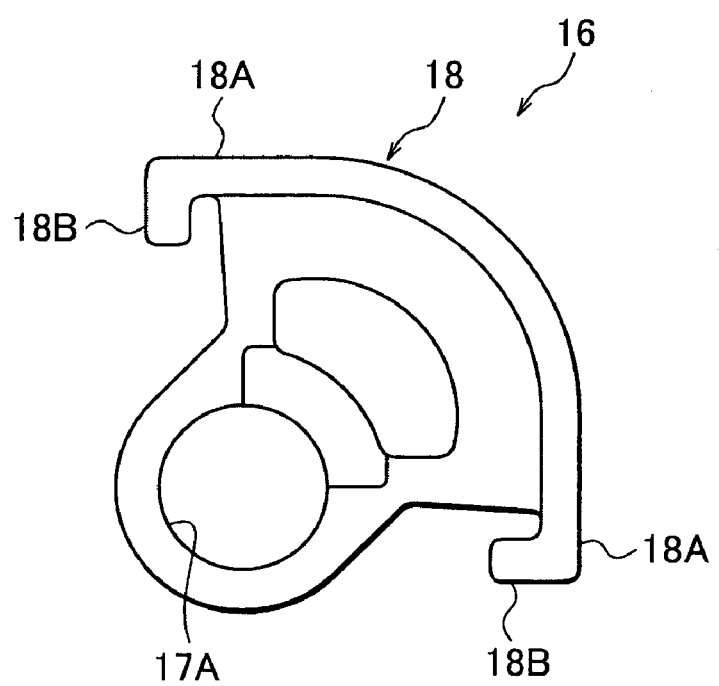
FIG. 11 is a top view of the lid corner insert of FIG. 10.
Figure 12:
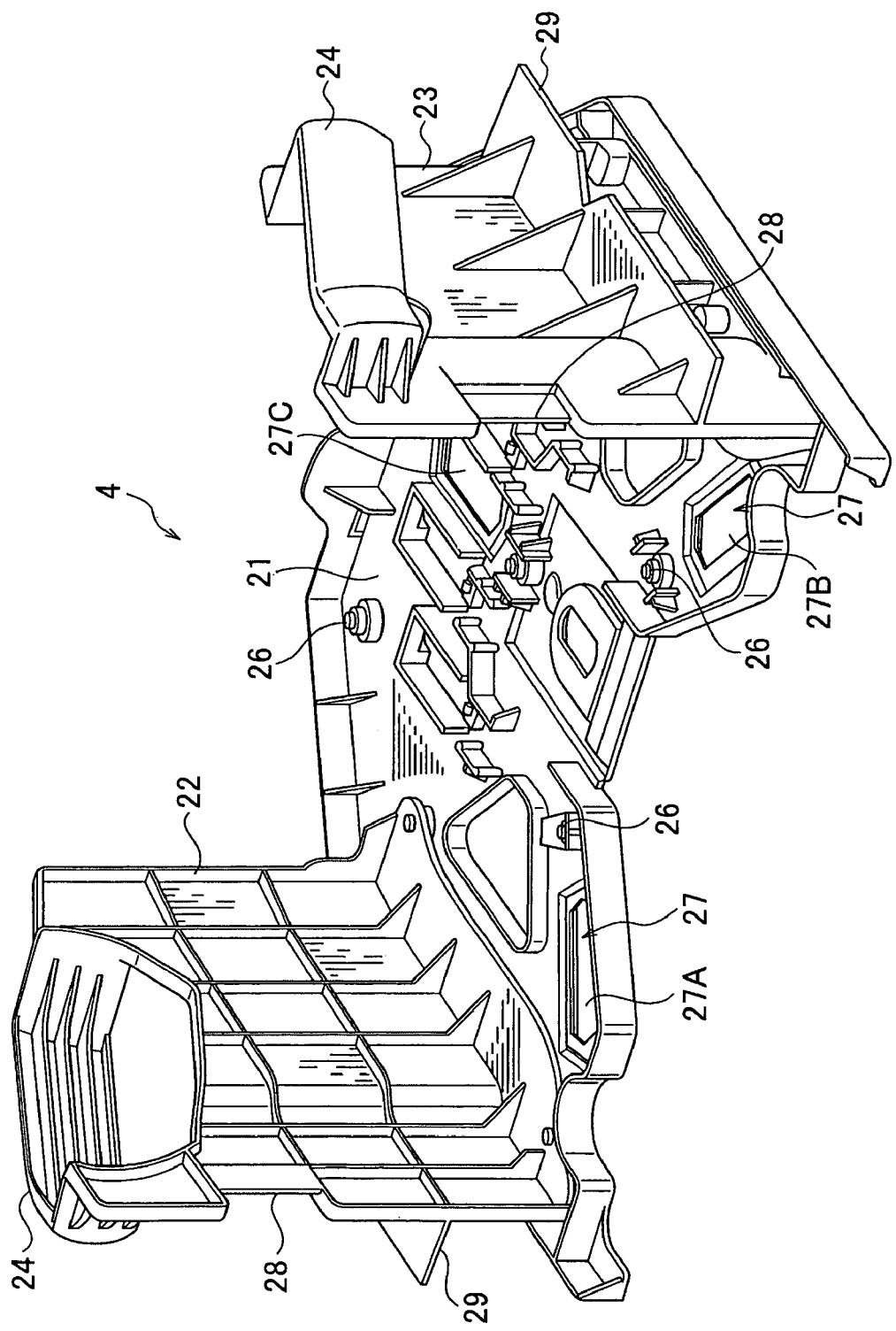
FIG. 12 is a perspective view of a supporting member.

Corner inserts 16 are located at each corner of the lid 3. These corner inserts 16 contact the lid support inserts 10 of the container body 2 to support the lid 3. Each of the corner inserts 16 includes a fixing plate portion 17 and a contacting plate portion 18, as shown in FIGS. 10 and 11. The fixing plate portion 17 has a shaft hole 17A, and the fixing plate portion 17 is inserted into and fixed within a groove (not shown) at each corner of the periphery of the lid 3. The contacting plate portion 18 is curved to cover a corner of the lid 3. Both sides of the outer surface of the contacting plate portion 18 are formed as flat (planar) contacting surfaces 18A for contact with the contact protrusion 11A of the lid support inserts 10. Support legs 18B are formed at both ends of the contacting plate portion 18. These support legs 18B bend inward to support the contacting surface 18A by contact with peripheral wall of the lid 3. Each contacting surface 18A contacts a contact protrusion 11A of the lid support insert 10 to support the lid 3. Therefore, if the lid body 2 receives a shock, the lid 3 does not slip.

The material of the lid support inserts 10 and the corner insert 16 must be a material that generates little dust when these elements contact each other. In particular, PBT (polybutylene terephthalate) resin, PEEK (polyether ether keton) resin, polyacetal resin, supermacromolecular PE (polyethylene) resin, or nylon resin is used as the material of the lid support insert 10. Alternatively, PTFE (polytetrafluoroethylene) and/or carbon fiber are also suitable. PBT resin, PEEK resin, polyacetal resin, supermacromolecular PE resin, nylon resin, and PTFE and/or carbon fiber, in addition to the five aforementioned materials, are suitable for the corner insert 16. These materials may be suitably paired so as to generate little dust by friction.

On the rear side of the lid 3, there is a thin plate supporting member 40, the structure of which is described in more detail in connection with the second embodiment below.

Supporting member 4, which supports the container body 2, comprises, as shown in FIG. 12–16, a base plate portion 21, sidewalls 22 and 23, and handles 24.

The base plate portion 21 is a plate which directly supports the container body 2. The base plate portion 21 supports the container body 2 (lower part in FIG. 13) when laid on its side. The supporting member 4 and the container body 2 are fastened to each other by screws with a plurality of supporting bars 26, placed on the surface of the base plate portion 21 and supporting the container body 2. In addition, positioning engagement portions 27 ("positioning means") are provided on the base plate portion 21 for adjusting the mounting position of the thin plate storage container. This storage container is provided with three engagement elements, 27A, 27B, and 27C. Each of the three engagement elements, 27A, 27B, and 27C, consists of a V-shaped groove. The angle between the longer axes of the engagement elements, 27A, 27B, and 27C is generally 120°, and the three engagement elements are oriented in three different directions. The dimensions, angle and the like of the positioning engagement portions 27 have been standardized. There are three engagement protrusions (not shown) at positions corresponding to the position of and mating with each of the engagement elements, 27A, 27B, and 27C, when the container body 2 is mounted. These engagement protrusions control the position of the container body 2 precisely by respectively engaging the engagement elements 27A, 27B, and 27C.

Side plates 22 and 23 extend perpendicular from opposite ends of the base plate 21. Handles 24, detents 28, and conveyor rails 29 are provided on the side plates 22 and 23. The handles 24 for lifting the container body 2 are formed integral with the upper ends of the side plates 22 and 23. The detents 28 are located on the forward edges of the side plates 22 and 23 (near edge of FIG. 12). The detents 28 are formed in the side plates 22 and 23 as thinned and hollowed recesses for receiving lugs 30 to be described below.

The lugs 30 are designed to securely support the supporting member 4 on the container body 2 by engaging with the detents 28 and thereby prevent the side plates 22 and 23 from opening. The lugs 30 are located on the outer surfaces of the side plates 2A and adjacent the opening 2B of the container body 2 (right side of FIG. 15). The cross-section of the lugs 30 is L-shaped so that the lugs 30 engage the detents 28 on the side plates 22 and 23.

The conveyor rails 29, located on the outside of each side plate 22 and 23 allow the containers 1 to be suspended from and carried by conveyors of a production line or the like within a factory. The conveyor rails 29 are flat plates and are horizontally aligned along the entire length (longitudinal dimension) of each side plate 22 and 23.

Reinforcement ribs are placed lengthwise and crosswise on the base plate 21 and side plates 22 and 23 to reinforce the entire body.

When semiconductor silicon wafers are placed in the container body 2 and then the lid 3 is put in place, the lid support inserts 10 on the lid receptacle 7 of the container body 2 and the corner inserts 16 of the lid 3 directly contact each other, or have a slight gap. The wafer storage container 1 is then conveyed to its destination in this state.

During conveyance, if the container body 2 receives a shock due to careless handling or the like, the lid support inserts 10, in contact with the corner inserts 16, support the lid 3 to prevent slip of the lid 3 from the container body 2.

Generation of dust and the like is minimized because the lid support inserts 10 and the corner inserts 16 are made of PBT resin, PEEK resin, polyacetal resin, supermacromolecular PE resin, or nylon resin, and each contacting surface, 11A and 18A, is planar.

When holding the handles 24 and lifting the wafer storage container 1 the supporting member 4 is held directly, and the container body 2 is supported by the base plate 21. At this time, the side plates 22 and 23 are supported without opening since the latch fingers 30 on the sidewalls 2A and 2B of the container body 2 engage with the finger receptacle portions 28 on the side plate portions 22 and 23 of the supporting member 4, and when the handles 24 are held to lift the wafer storage container 1, the side plate portions 22 and 23 are stabilized without vacillation. There is no distortion or the like when held by the handles 24 because the distorting force is absorbed by the side plates 22 and 23 of the support member 4 and the base plate 21, and the affect on the container body 2 is thereby minimized. Therefore, there is no adverse effect on the sealing member between the container body 2 and the lid 3.

In a production line or the like in a factory, the conveyor rails 29 are held by a conveyor to transport the container. In addition, the positioning engagement elements 27 are used to precisely position the container body 2 when the container is mounted on a mounting stand.

As described above, if the container body 2 receives a shock, the lid support inserts 10 and the corner inserts 16 directly contact each other and the lid is supported without slip from the container body 2. Moreover, slip of the sealing member between the container body 2 and the lid 3 is prevented and the sealing quality of the seal of the wafer storage container 1 is thereby improved.

Generation of dust and the like is minimized because the contact protrusion 11A of each lid support insert 10 and the contacting surface 18A of the corner insert 16 are planar and the material of each contacting surface is carefully selected.

Modifications:

(1) Although the lid support inserts 10 and the corner inserts 16 are provided at each of four corners of the lid 3 in the first embodiment, the lid support inserts 10 and the corner inserts 16, alternatively, can be provided only on the lower edges of the container body 2 and lid 3. In this case, the same advantage as in above-described embodiment is achieved when the container is handled. The lid support inserts 10 and the corner inserts 16 can be placed on all of the four edges of the lid and lid receptacle or on one edge only, according to the intended use.

(2) The base plate 21 and the side plates 22 and 23 of the supporting member 4 are formed so that they can support the container body 2 and the handles 24, so various shapes, not only planar, can be adopted for them.

Second Embodiment

The second embodiment of the present invention is also illustrated, by way of example, as a storage container to store and carry thin-plate semiconductor silicon wafers (thin plates).

Figure 18:
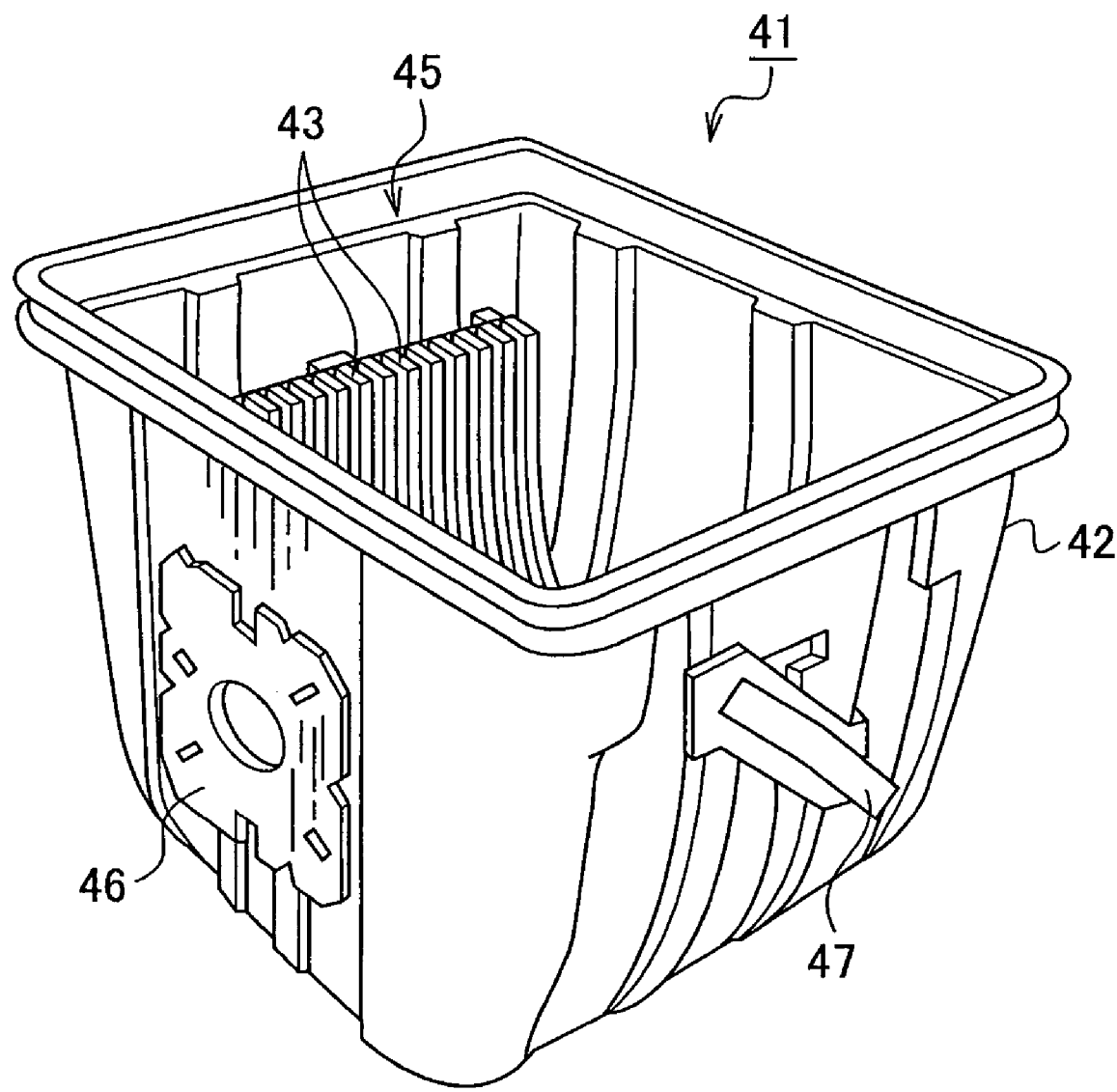
FIG. 18 is a perspective view of the container body of the thin plate storage container according to the second embodiment.
Figure 19:
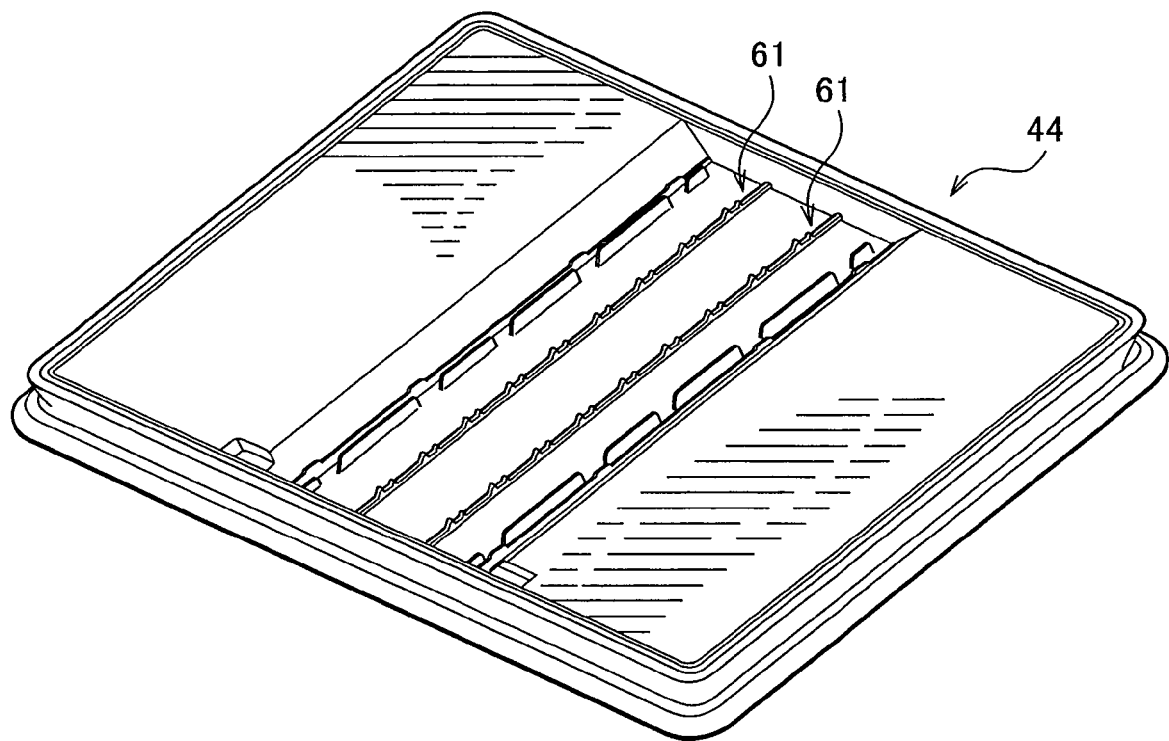
FIG. 19 is a perspective view of the lid of the thin plate storage container according to the second embodiment.
Figure 20:
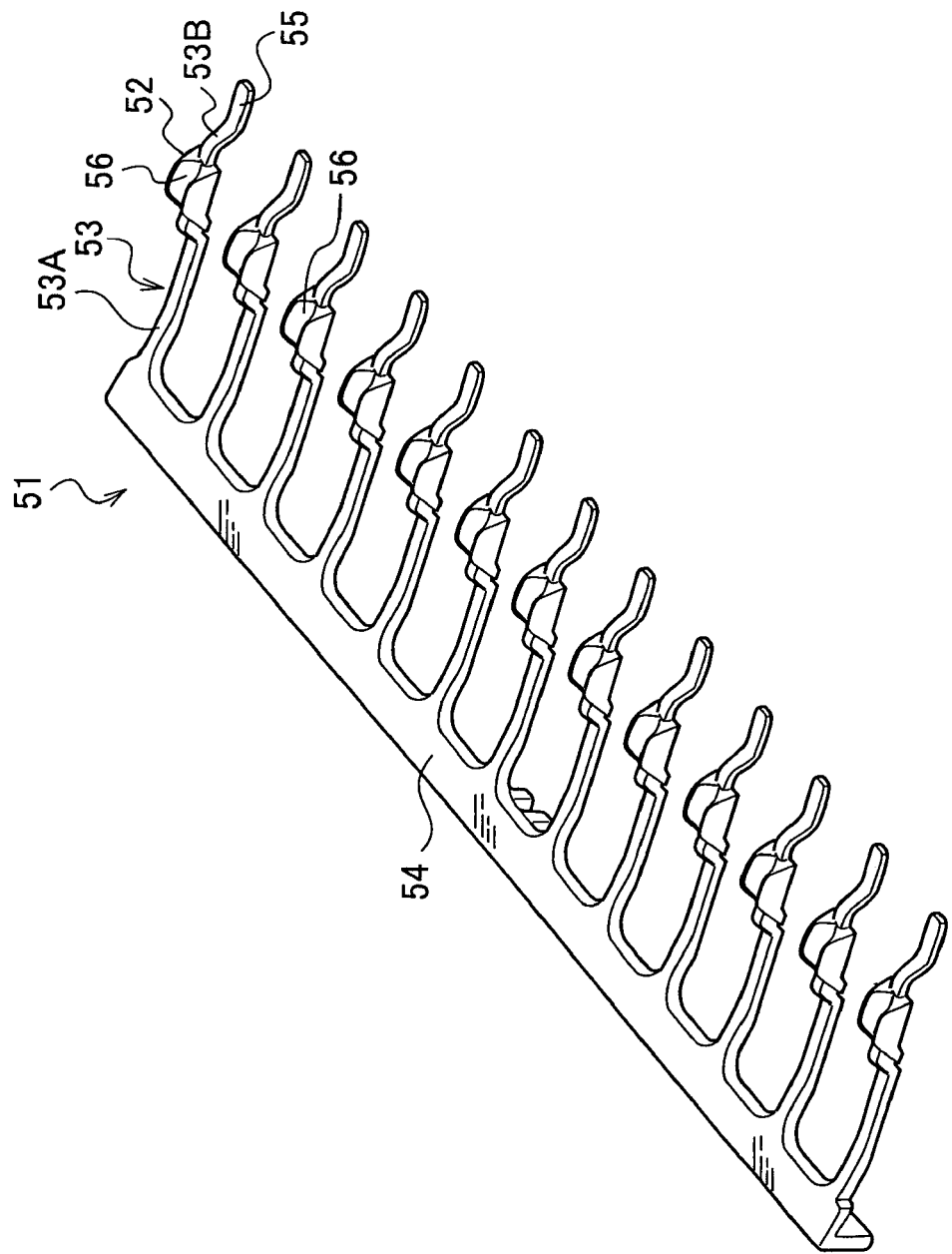
FIG. 20 is a perspective view of the reverse side (bottom) of the thin plate supporting member of FIG. 17.
Figure 21:
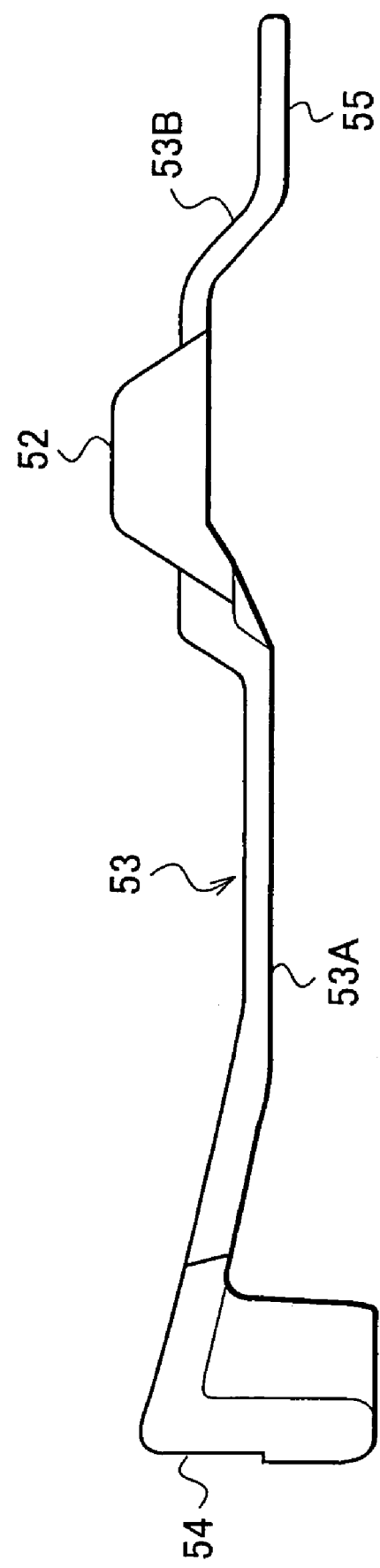
FIG. 21 is a side view showing the thin plate supporting member as shown in FIGS. 17 and 20.
Figure 22:
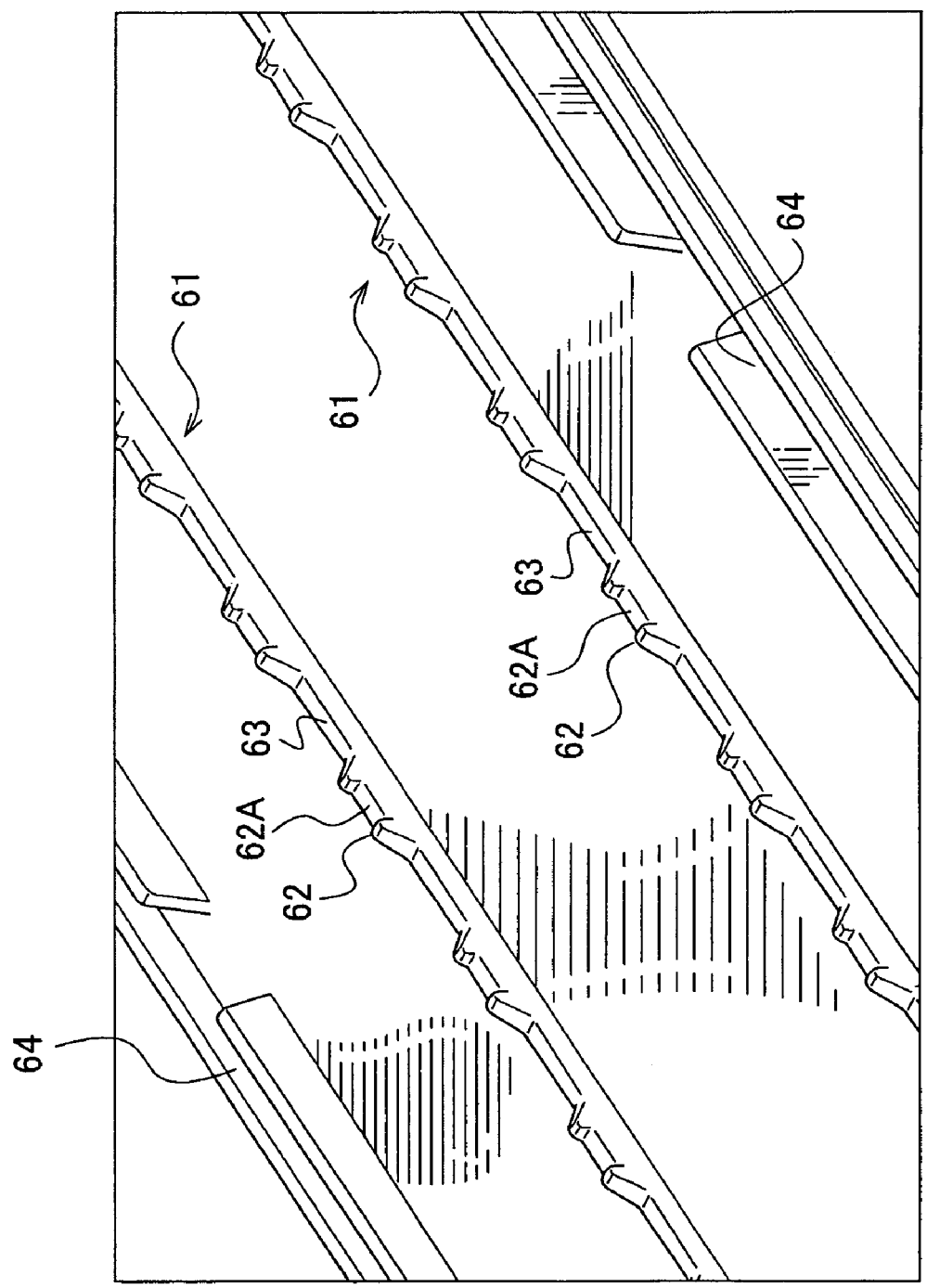
FIG. 22 is a perspective view showing a strip projection on the lid of the thin plate storage container according to the second embodiment.

This wafer storage container 41 of the second embodiment, as shown in FIG. 18 and FIG. 19, comprises a container body 42 for storing a plurality of semiconductor silicon wafers (not shown) therein. Wafer support plates 43 are provided on opposite side walls in the container body 42 for supporting the semiconductor silicon wafers from opposite sides of the wafers, which are stored within the container body, in parallel and at regular intervals. Lid 44 seals the upper opening of the container body 44 and keeps the container's inside clean.

A lid receptacle 45 is provided around the opening of the container body 42 to engage the lid 44. This lid receptacle (flange) 45 is similar to flange 7 of the first embodiment and is formed by enlarging the edges of the container body 42 surrounding the opening to meet the dimension of the lid. Various fixing means (not shown) are placed between the lid 44 and the lid receptacle 45 to fix the lid 44 onto the container body 42.

A carrier flange 46 (FIG. 18) is engaged by an arm of a carrier mechanism (not shown) on a production line when the container is carried. A handle is provided to enable a worker to carry the container by hand.

Thin plate supporting member 51 is fixed on the inner side of the lid 44 (upper side in FIG. 19). The thin plate supporting member 51 serves to support the upper edges of the stored semiconductor silicon wafers at regular intervals. The thin plate supporting member 51 will next be explained with reference to FIG. 17 and FIG. 19–23.

The thin plate supporting member 51 includes contacting portions 52 which engage the peripheries of the semiconductor silicon wafers and thereby support the semiconductor silicon wafers. The contacting portions 53 are, in turn, elastically supported by supporting portions 53. A base supporting bar 54 located on the inner side of the lid 44 (upper side of FIG. 19) supports a plurality of the supporting portions 53 in parallel, integrally and at regular intervals.

Engagement grooves 56 are formed in the surfaces of the contacting portions 52 facing the semiconductor silicon wafers. These engagement grooves 56 serve to engage the peripheries of the semiconductor silicon wafers to support the wafers. The supporting portions 53 are provided integrally on both sides of the contacting portions 52.

Figure 23:
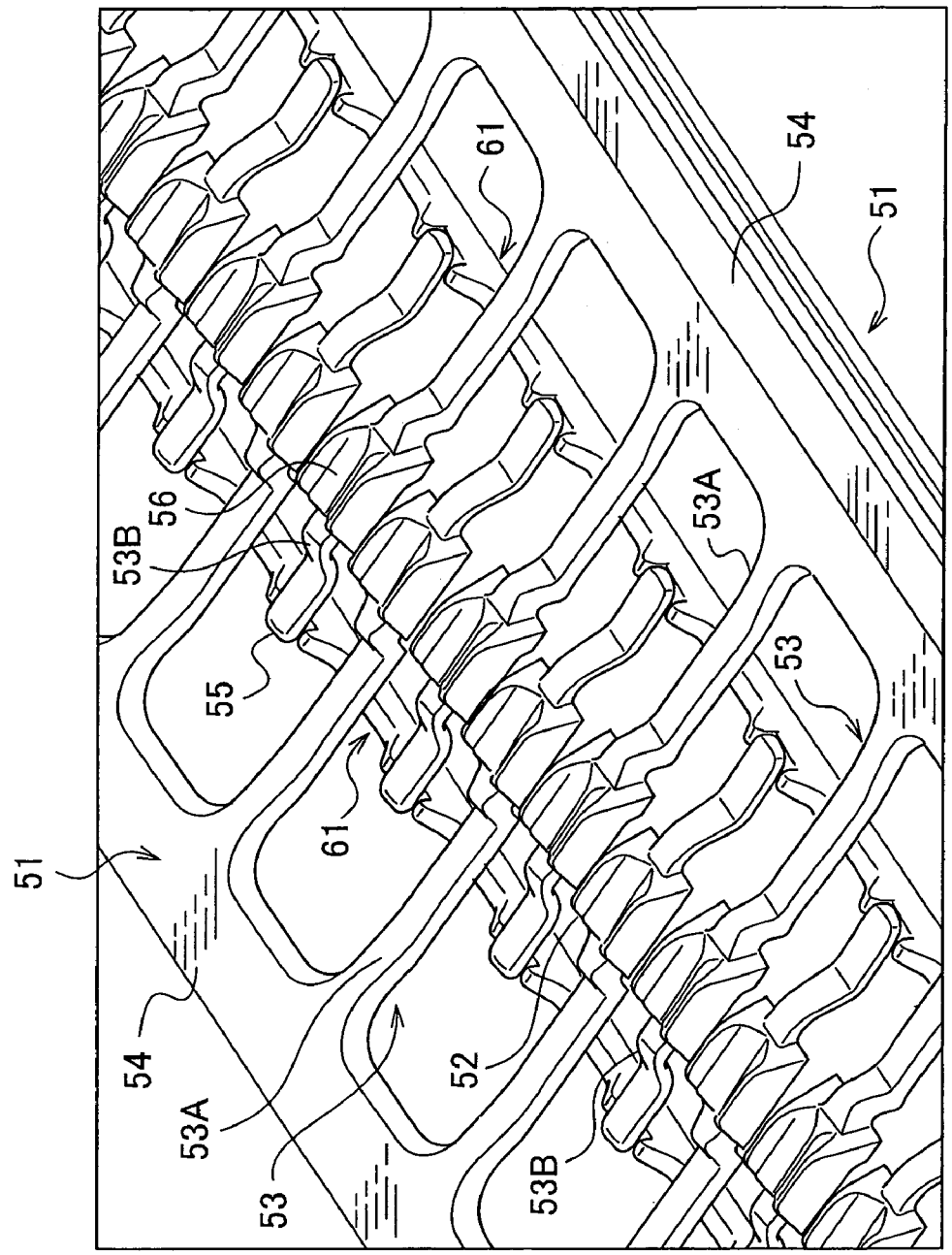
FIG. 23 is a perspective view of the thin plate supporting member of the second embodiment (FIGS. 17, 20 and 21), mounted on the strip projections (FIG. 22).

The supporting portions 53 are formed integral with the contacting portions 52 to support them. The supporting portions 53 are formed in the shape of rods, are made of an elastic synthetic resin, and support the contacting portions 52. The contacting portions 52 are positioned at the middle of the supporting portions 53. Therefore the contacting portions 52 divide the base supporting portions 53A from the tip supporting portions 53B. Each base end of the tip supporting portions 53B is formed integral with a contacting portion 52. Caul plate portions 55 are formed at the ends of the tip supporting portions 53B. The caul plate portions 55 engage the engagement portions 62A of supporting stages 62 (as shown in FIG. 23) to support the tip supporting portions 53B. The contacting portions 52 are thereby elastically supported by the base supporting portions 53A and the tip supporting portions 53B from opposite sides.

The base supporting portions 53A are formed relatively long, and the tip supporting portions 53B are shorter. Since the base supporting portions 53A are longer, the base supporting portions 53A press the contacting portions 52 onto the periphery of the semiconductor silicon wafers with a weak force at first when the contacting portions 52 contact the peripheries of the semiconductor silicon wafers. Then, since the tip supporting portions 53B are shorter, the caul plate portions 55 at the end of the tip supporting portions 53B contact the inner surface of the lid 44, and support the contacting portions 52 with a strong force, whereby the contacting portions 52 are pressed onto the peripheries of the semiconductor silicon wafers with a strong force.

Depending on the situation, there may be gaps of a predetermined width between the tip supporting portions 53B and the engagement portions 62A of the supporting stages 62 (FIG. 23). If a gap is present, the contacting portions 52 are supported by only the base supporting portions 53A from one side and therefore support the semiconductor silicon wafers with a weak force. In addition, if the semiconductor silicon wafers are shaken hard by an external force such that the wafer storage container 41 is swung or the like, the contacting portions 52 are pushed and thereby the tip supporting portions 53B come into contact with the engagement portions 62A of the supporting stages 62 to elastically support the semiconductor silicon wafers with a strong force. On the other hand, if gaps are not present, the semiconductor silicon wafers are supported with strong force from the start.

In the supporting portions 53, both sides of the contacting portions 52 are formed to protrude in the direction of the semiconductor silicon wafers stored in the container body 42. Slanted portions of the supporting portions 53 serve to enhance the elastic force of the supporting portions 53.

Base supporting bars 54 are integral with and support supporting portions 53 in parallel and at regular intervals. These base supporting bars 54 are also engaged with support grooves 64 (FIG. 22) to be fixed on inner side of the lid 44.

Projecting strips 61 on the inner side of the lid 44 support the tips of the supporting portions 53. The strips are formed with supporting stages 62 and supporting recesses 63 aligned alternately. Two supporting recesses 63 are arranged in parallel on the inner side of the lid 44. This structure supports caul plates 55 opposite two thin plate supporting members 51. The supporting stages 62 of one strip are aligned with the supporting recesses 63 of the other strip projection. Namely, the supporting stages 62 and the supporting recesses 63 are arranged opposing each other.

The supporting stages 62 of the strips 61 support the caul plates 55 on the distal ends of the supporting portions (arms) 53. The engagement portions 62A are formed on the supporting stages 62 to engage the caul plates 55 on the tips of the supporting portions 53 and to support the caul plates 55. The engagement portions 62A are formed as recesses and engage the caul plates 55 to prevent rightward and leftward slip.

The supporting recesses 63 engage and support the base supporting portions 53A. The supporting recesses 63 are cut deeper into strips 61 than the supporting stages 62. The height of the supporting recesses 63 is set optimally according to the intended use. If a user wants to support the semiconductor silicon wafers with strong force, the height of the supporting recesses 63 should be set so that the base supporting portions 53A are in contact with the supporting recesses 63. On the other hand, if a user does not wants to support the wafers with strong force, the height of the supporting recesses 63 should be set so that the base supporting portions 53A are not in contact with the supporting recesses 63.

The two strip projections 61 are provided with grooved supports 64 to engage and support the base support bars 54 of the thin plate supporting member 51. The grooves of the grooved supports 64 are sized to mate with the base support bars 54. Two base supporting bar portions 54 of the thin plate supporting members 51 opposing each other are fitted within the grooves of grooved supports 64, and are thereby aligned to support the semiconductor silicon wafers at regular intervals. The two thin plate supporting members 51 have the same structure and are opposed to each other.

In use, a plurality of semiconductor silicon wafers is stored inside the container body 42 wherein they are supported by the wafer supporting plates 43 at regular intervals. The lid 44 is then fitted on the container body 42 whereby the contacting portions 52 of the thin plate supporting members 51 engage and support each semiconductor silicon wafer.

When the lid 44 is fully seated in the lid receptacle 45, the contacting portions 52 are pushed up by the silicon wafers toward the inner side of the lid 44. Thereby the base supporting portions 53A, support the contacting portions 52 with a weak force which is received by the semiconductor silicon wafers. However, if the caul plate portions 55 engage the engagement portions 62A of the supporting stages 62, the contacting portions 52 are supported from both sides, and the semiconductor silicon wafers are then supported by a stronger force. Further, if the base supporting portions 53A come into contact with the supporting recesses 63, then the supporting stages 62 and the supporting recesses 63, opposite each other, also support the contacting portions 52, i.e. support the supporting portions 53 directly and the contacting portions 52 indirectly, whereby each semiconductor silicon wafer is supported by a yet stronger force.

The above-described structure serves to support both small light semiconductor silicon wafers and large heavy semiconductor silicon wafers securely with optimum force.

Moreover, almost no dust is generated at points of contact, so generation of dust and the like can be minimized.

Since the thin plate supporting member 51 is formed so that the contacting portions 52 are aligned oppositely and alternately, the distance between the contacting portions 52 and between the supporting portions 53 of the thin plate supporting member 51 can be relatively wide and the thin plate supporting members 51 can be molded more easily. The structure of the metal mold can be simplified, whereby the metal mold can be made inexpensively and the production cost of the thin plate supporting member 51 can be reduced.

Modifications of the Second Embodiment (1) Although two thin plate supporting members 51 are used in the second embodiment as described above, one, two or more than three thin plate supporting members 51 can also be used according to the number of the semiconductor silicon wafers to store and the same function and effect as in the above-described embodiments can be obtained.

Figure 24:
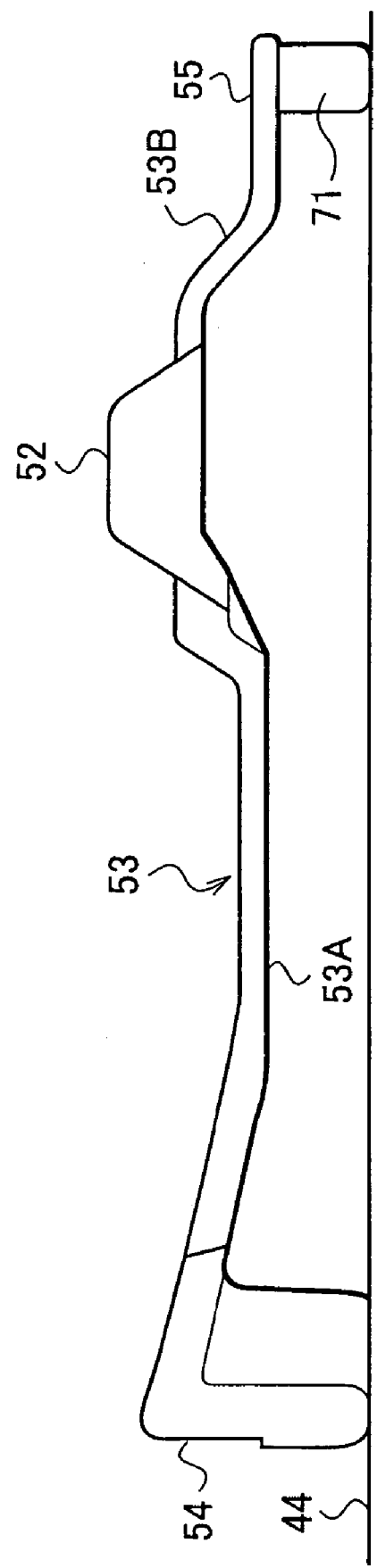
FIG. 24 is a side view of a first modification of the second embodiment.
Figure 25:
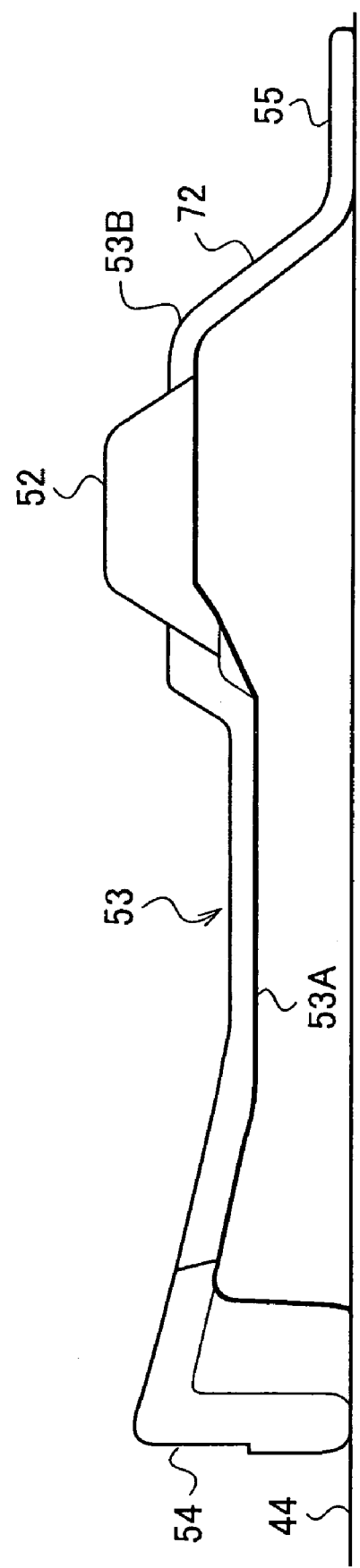
FIG. 25 is a side view of the second modification of the second embodiment.
Figure 26:
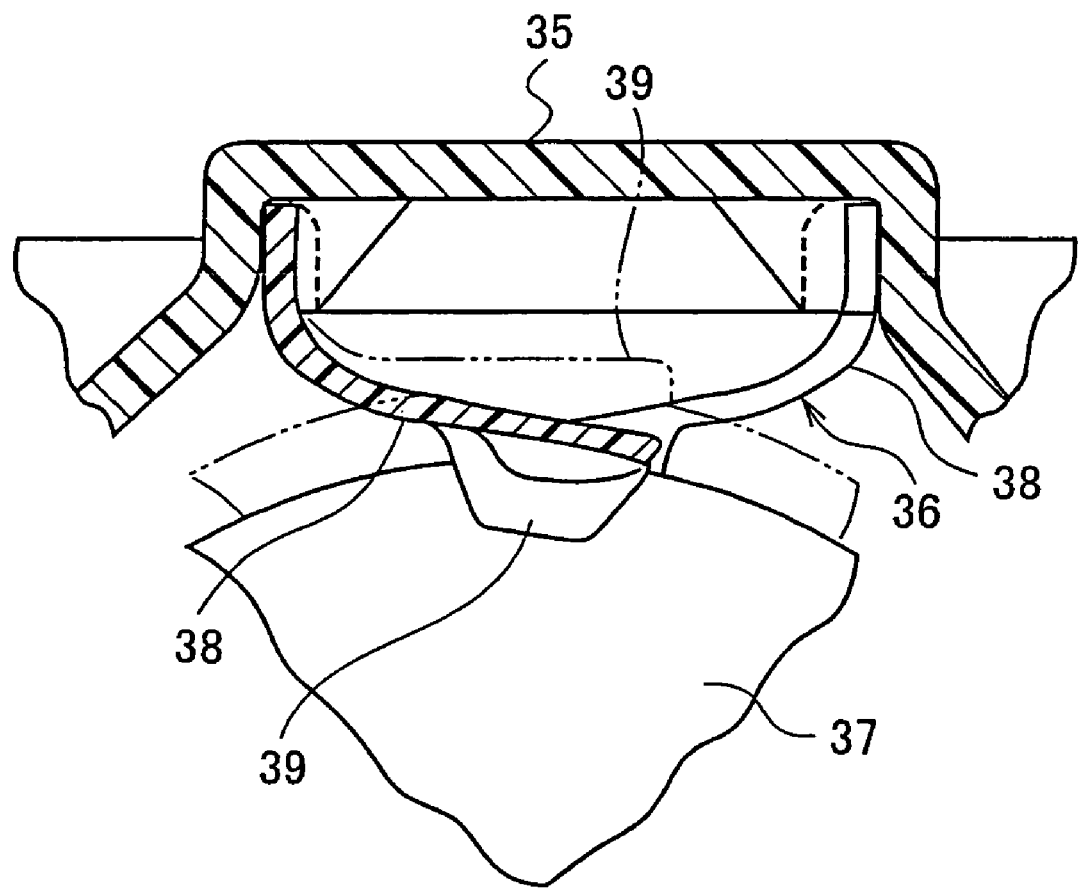
FIG. 26 is a sectional view of a main part of a thin plate supporting member of the prior art.

(2) Although the supporting stages 62 are placed on the inner side of the lid 44 to support the tip ends of the supporting portions 53 in the second embodiment, it is also possible to locate the supporting stage portions 71 on the caul plate portions 55 as shown in FIG. 24. Further, as shown in FIG. 25, it is also possible to elongate and extend the tip (distal) supporting portions 53B to the inner side of the lid 44 to become lid support inserts 72, while realizing the same function and effect as in as above-described embodiments.

(3) Although semiconductor silicon wafers are mentioned as an example of thin plates in the foregoing description of the first and second embodiments, other thin plates, such as glass plates, memory discs and the like, can be also be used within the thin plate storage container of present invention.

What is claimed is:

1. A thin plate storage container including a container body, having opposing side wall portions, for storing a plurality of thin plates in a clean condition, a lid for closing and sealing the interior of the container body, and a supporting member for receiving, mating with and supporting the container body;

wherein said supporting member comprises:

a base plate portion;

two side plate portions extending from opposing ends of the base plate portion and standing upright when the base plate portion is horizontally oriented, for receiving the container therebetween;

a detent respectively located at a forward edge of each of the two side plate portions;

a lug respectively provided on each opposing side wall portion of the container body for engaging the detents, to thereby interlock the container body with the side plate portions of the supporting member so as to prevent the side plate portions from opening;

two handles respectively located on the two side plate portions for lifting the container body; and two conveyor rails respectively located on exterior surfaces of the two side plate portions and protruding outwardly, in opposite directions, from the exterior surfaces of the two side plate portions, for suspension from and being carried by a production line conveyor; and wherein the base plate portion, the two side plate portions, the two handles, and the two conveyor rails are integrally formed.

2. The thin plate storage container according to claim 1, further comprising positioning means on the base plate portion of the supporting member for precisely adjusting the mounting position of the container body.

3. The thin plate storage container according to claim 1 wherein the conveyor rails are flat plates protruding perpendicular from the respective side plate portions.

4. The thin plate storage container according to claim 3 wherein said conveyor rails are coextensive with the dimension of the side plate portions parallel to the bottom plate portion.

* * * * *

UNITED STATES PATENT AND TRADEMARK OFFICE
CERTIFICATE OF CORRECTION

PATENT NO.       : 7,216,766 B2                           Page 1 of 1
APPLICATION NO.  : 11/242531
DATED            : May 15, 2007
INVENTOR(S)      : Chiaki Matsutori et al.

It is certified that error appears in the above-identified patent and that said Letters Patent is hereby corrected as shown below:

On the Title Page, Item 56 under the heading "U.S. PATENT DOCUMENTS" add:

-- 6,206,196    3/2001   Krampotich et al 6,848,578    2/2005   Eggum

2002/005369  1/2002   Nyseth et al --

Signed and Sealed this

Fifth Day of January, 2010

David J. Kappos
*Director of the United States Patent and Trademark Office*